United States Patent
Ned

(10) Patent No.: US 8,704,356 B2
(45) Date of Patent: Apr. 22, 2014

(54) HIGH TEMPERATURE INTERCONNECT ASSEMBLIES FOR HIGH TEMPERATURE ELECTRONICS UTILIZING TRANSITION PADS

(75) Inventor: Alex A. Ned, Kinnelon, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

(21) Appl. No.: 13/586,009

(22) Filed: Aug. 15, 2012

(65) Prior Publication Data

US 2014/0048936 A1  Feb. 20, 2014

(51) Int. Cl.
 *A61B 1/00* (2006.01)
 *H01L 23/48* (2006.01)

(52) U.S. Cl.
USPC ........... 257/697; 257/773; 257/780; 257/784; 257/E23.011; 257/E23.02; 257/E23.016; 257/E23.174

(58) Field of Classification Search
USPC ................. 257/780, 781, 782, 784, 697, 773, 257/E23.011, E23.02, E23.016, E23.174
See application file for complete search history.

(56) References Cited

U.S. PATENT DOCUMENTS

2012/0146204 A1* 6/2012 Lee et al. .................. 257/676

FOREIGN PATENT DOCUMENTS

JP  64-49249  * 2/1989 ................ 257/784

* cited by examiner

*Primary Examiner* — Jasmine Clark
(74) *Attorney, Agent, or Firm* — Troutman Sanders LLP; James E. Schutz; Edward M. Roney

(57) ABSTRACT

An interconnect assembly that operates in environments well exceeding 200° C. without degradation and/or failure. The interconnect assembly of the present invention eliminates the incompatible metal interfaces of the prior art and relies on aluminum first-metal wire to electrically connect to first-metal pads on a chip and a second-metal wire to electrically connect to second-metal plated contacts on a package. Both wire types are then electrically connected together utilizing a high temperature transition pad disposed between the chip and contacts on the package, therefore eliminating incompatible metal interfaces of the prior art.

20 Claims, 4 Drawing Sheets

HIGH TEMPERATURE INTERCONNECT ASSEMBLIES FOR HIGH TEMPERATURE ELECTRONICS UTILIZING TRANSITION PADS

TECHNICAL FIELD

The present invention relates to high temperature interconnect assemblies utilizing incompatible metals for high temperature electronics.

BACKGROUND

High temperature electronic chip operability depends primarily on chip packaging. Currently, wedge and ball wire bonding techniques are primarily used in prior art devices to interconnect electronic chips and the corresponding package. The biggest limitation associated with this packaging, however, is the failure of metallurgical interconnections between the chip and the corresponding package due to metal incompatibility.

As illustrated in FIG. 1, there is shown a prior art configuration of a chip-package assembly having high temperature operability of up to 200° C. As illustrated, a gold wire interconnects aluminum pads disposed on a chip and gold-plated areas on a corresponding package, thus forming gold-aluminum intermetallic compounds, commonly known as "purple plaque". These gold-aluminum intermetallic compounds, however, are prone to bond degradation and/or failure at temperatures above 200° C. Such degradation and failure becomes more pronounced with increased temperature, and this interconnection scheme becomes impractical for operation in environments exceeding 225° C. Such characteristics are common between incompatible metals, as incompatible metals are prone to bond degradation and failure at their interfaces.

A number of metallurgical interconnection schemes involving aluminum, indium, gold, silver, platinum, nickel, copper, etc., have been used as alternative interconnect embodiments, however none of these elements provide a clear-cut interconnect solution. The most widely used alternative method utilizes an aluminum wire to interconnect aluminum pads on a chip and gold plated glass/pins on a package. This prior art configuration is illustrated in FIG. 2. In this configuration, however, Kirkendall voids and intermetallic formation remain factors at the aluminum/gold plated pad interface at temperatures exceeding 200° C.

As demonstrated, the presence of aluminum-to-gold interfaces present temperature limitations in prior art configurations. However, separate aluminum-to-aluminum and gold-to-gold interfaces exhibit excellent performance characteristics with no signs of failure at temperatures above 250° C., thus the present invention describes a novel approach to solving the aforementioned interconnection problems by eliminating incompatible metal interfaces of the prior art.

BRIEF SUMMARY

Exemplary embodiments of the present invention provide a high temperature interconnect assembly. The interconnect assembly comprises a first-metal to first-metal, e.g., aluminum to aluminum, interconnect that interconnects a chip to a transition pad and a second-metal to second-metal, e.g., gold to gold, interconnect that interconnects a package contact to the same transition pad. The transition pad facilities communication between the chip and the package contact without an incompatible metal interface. The transition pad may be of a material that is compatible to both the first-metal and second-metal.

The interconnect assembly may comprise (1) a semiconductor chip that has at least one first-metal pad disposed on a first surface, (2) a second-metal plated package contact, and (3) a transition pad disposed therebetween. The first-metal pad on the semiconductor chip and the transition pad are in electrical communication via a first-metal interconnect and the second-metal plated package contact and the transition pad are in electrical communication via a second-metal interconnect. The transition pad facilitates communication between the chip and the second-metal plated package without incompatible first-metal to second-metal interfaces. In an exemplary embodiment, the transition pad may comprise a platinum-based top surface. In another exemplary embodiment, the transition pad may be a silicon-on-insulator device.

BRIEF DESCRIPTION OF THE DRAWINGS

FIG. 4b illustrates an exemplary embodiment of the transition pad of FIG. 4a.

DETAILED DESCRIPTION OF PREFERRED EMBODIMENTS

Figure 1:
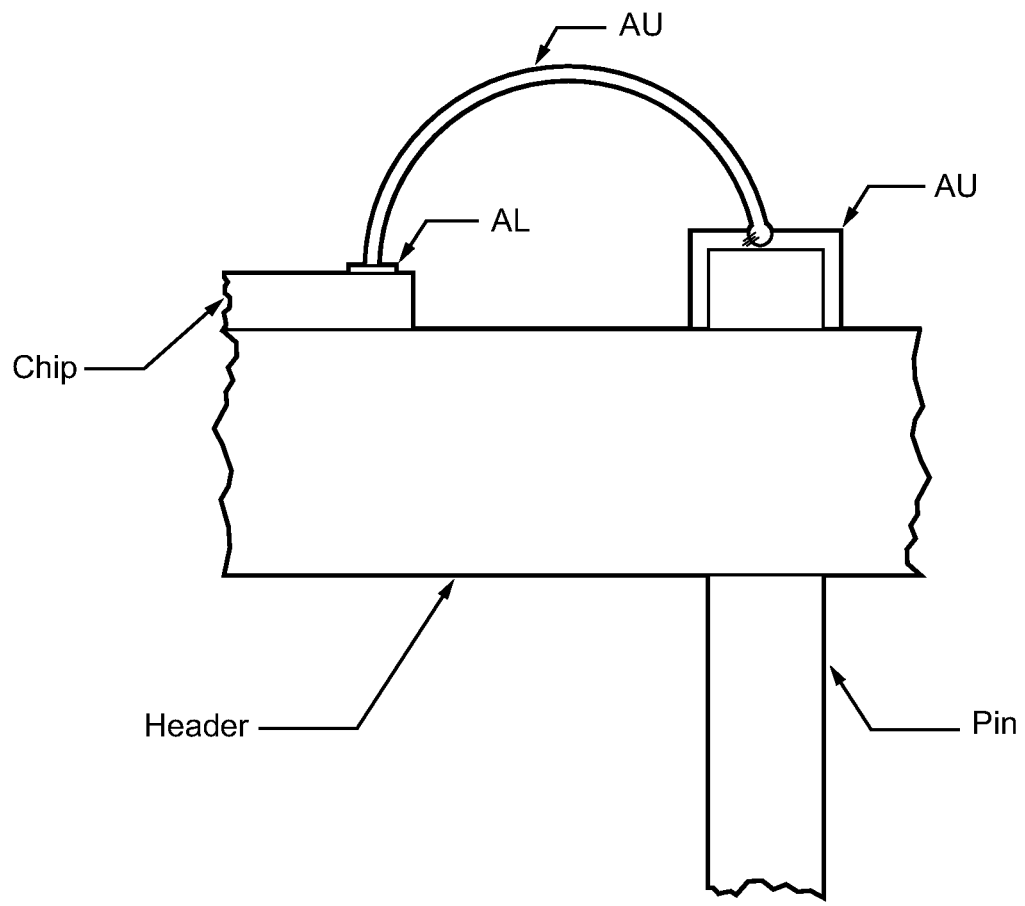
FIG. 1 illustrates a prior art chip-package assembly utilizing a gold wire to interconnect aluminum pads on the chip and gold-plated areas on the package.
Figure 2:
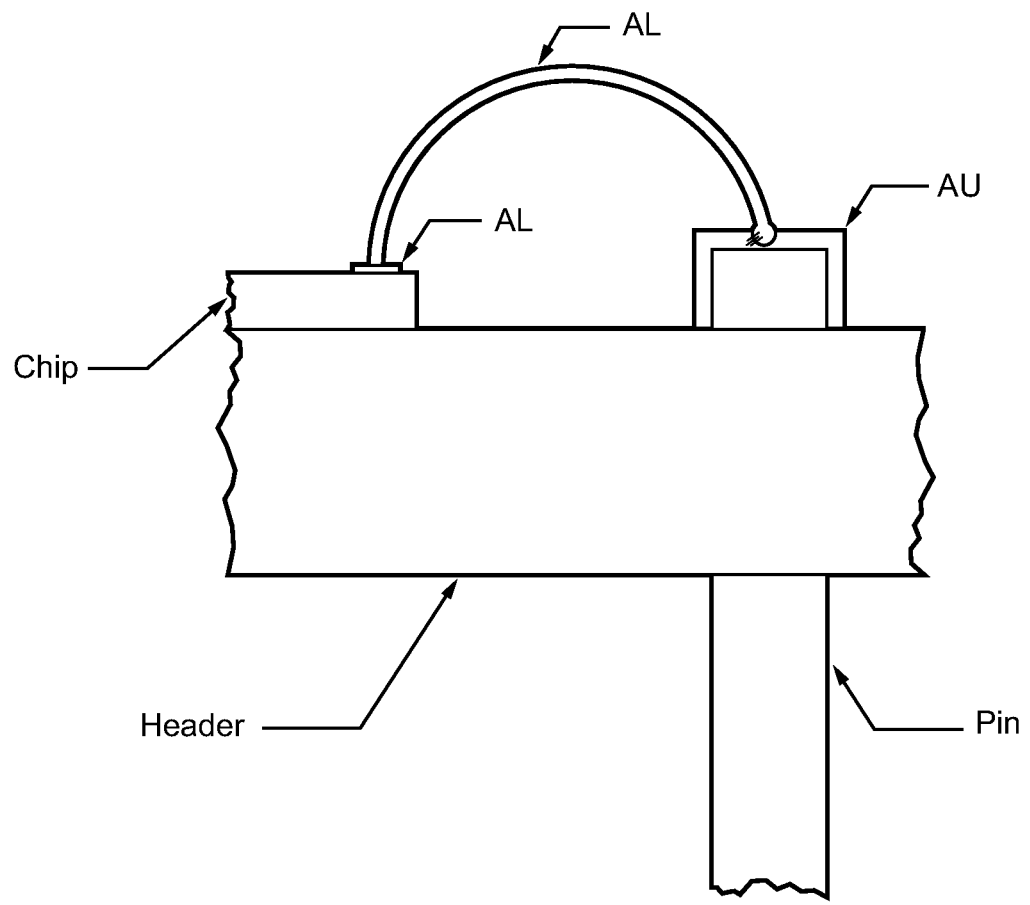
FIG. 2 illustrates a prior art chip-package assembly utilizing an aluminum wire to interconnect aluminum pads on the chip and gold-plated areas on the package.

Although preferred embodiments of the invention are explained in detail, it is to be understood that other embodiments are contemplated. Accordingly, it is not intended that the invention is limited in its scope to the details of construction and arrangement of components set forth in the following description or illustrated in the drawings. The invention is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an," and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Referring now to the drawings, in which like numerals represent like elements, exemplary embodiments of the present invention are herein described. It is to be understood that the figures and descriptions of the present invention have been simplified to illustrate elements that are relevant for a clear understanding of the present invention, while eliminating, for purposes of clarity, many other elements found in typical pressure sensor assemblies and chip-package assemblies and methods of making and using the same. Those of ordinary skill in the art will recognize that other elements are desirable and/or required in order to implement the present invention. However, because such elements are well known in the art, and because they do not facilitate a better understanding of the present invention, a discussion of such elements is not provided herein.

Exemplary embodiments of the present invention provide an interconnect assembly that is operable in environments well exceeding 200° C. without degradation and/or failure. The various embodiments of the present invention eliminate incompatible metal interfaces of the prior art, for example aluminum-gold interfaces, and rely on first-metal wires to interconnect first-metal pads on a chip and second-metal wires to interconnect second-metal contacts on a package, wherein the first-metal and the second-metal are incompatible metals. Both wire types are then electrically connected together utilizing a high temperature transition pad disposed between the chip and the package, therefore eliminating the incompatible metal interfaces of the prior art.

It shall be understood that incompatible metals are metals that, when bonded together, may suffer bond degradation and/or failure at high temperatures. It shall be further understood that while the exemplary embodiments described below specifically reference gold-aluminum metallization, the exemplary embodiments are not limited to those elements and these elements are provided for example purposes only. Rather, the exemplary embodiments encompass other incompatible metal combinations, for example but not limited to, aluminum-copper, cadmium-copper, aluminum-nickel, zinc-copper, to name a few.

Figure 3:
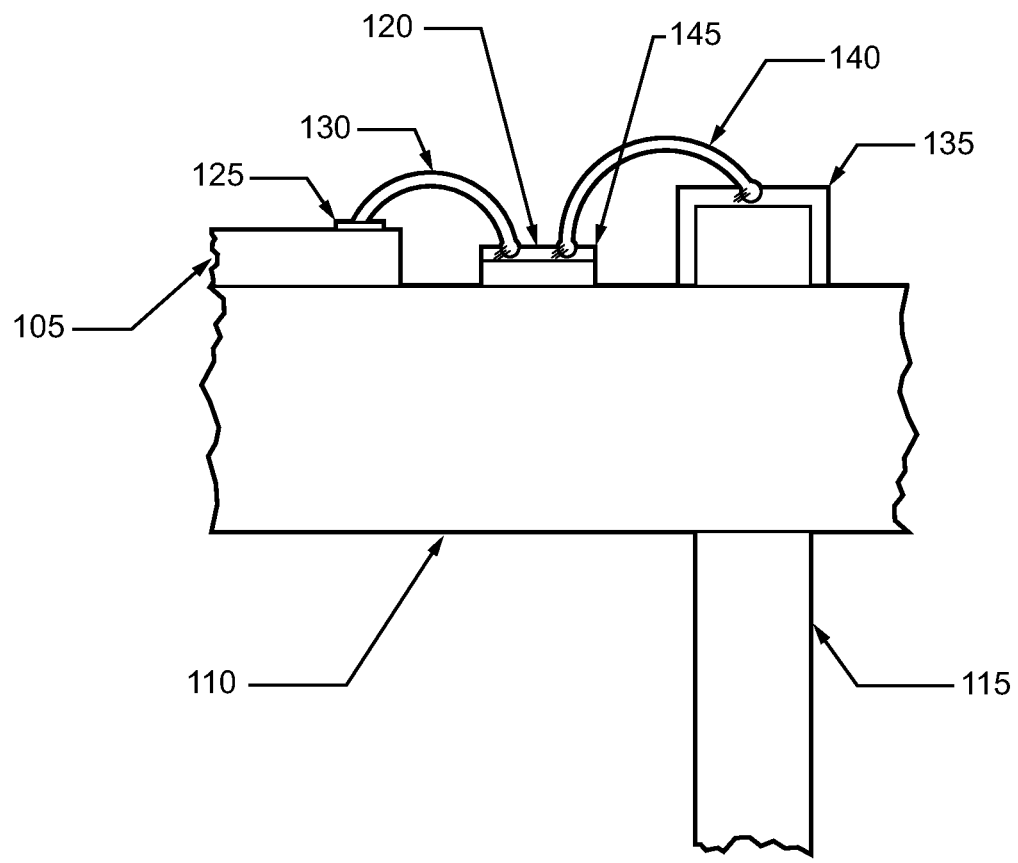
FIG. 3 illustrates an exemplary embodiment of a chip-package assembly utilizing a transition pad to avoid incompatible metallization.

Referring to FIG. 3, there is shown a high-temperature interconnect assembly in accordance with the present invention. As illustrated, there is shown a header 110 and a chip 105 that is disposed on a top surface of the header 110. The chip 105 may be a semiconductor chip comprising an integrated circuit, for example but not limited to, a piezoresistive Wheatstone bridge circuit, and may be configured to sense an applied physical parameter, for example but not limited to, pressure, temperature, or combinations thereof. After sensing the physical parameter, the chip 105 submits a signal substantially indicative of said applied physical parameter. A first-metal pad 125 may be disposed on a top surface of the chip 105 such that the first-metal pad 125 is in electrical communication with the chip 105. The first-metal pad 125 receives the signal substantially indicative of the applied pressure from the chip 105 and transmits the signal to a transition pad 120 via a first-metal wire 130, as the first-metal wire 130 interconnects the first-metal pad 125 and the transition pad 120. The first-metal can be, for example, aluminum.

At least one package pin 115 may extend through the header 110 opposite the chip 105. It shall be understood that the package contact may be a pin, glass, etc. The package pin 115 is indirectly in electrical communication with the chip 105 and thus receives the signal substantially indicative of the applied physical parameter from the chip 105 and relays the signal to a final output device. The package pin 115 comprises a second-metal plated surface 135. This second-metal plated surface 135 of the package pin 115 is in electrical communication with the transition pad 120 via a second-metal wire 140, and the second-metal wire 140 interconnects the second-metal plated surface 135 and the transition pad 120. One skilled in the art will appreciate that the second-metal is incompatible with the first-metal. Thus, in one example, the first-metal may be aluminum, and the second-metal may be gold. However, as previously stated, the first-metal and second-metal may be other incompatible metallization combinations as well.

It shall be understood that the first-metal wire 130 and the second-metal wire 140 do not physically contact on the transition pad 120, thus there are no incompatible first-metal to second-metal interfaces in the various exemplary embodiments. Rather, the transition pad 120 acts as an intermediary and facilitates indirect electrical communication between the first-metal wire 130 and the second-metal wire 140, and thus facilitates indirect electrical communication between the chip 105 and the package pin 115 without the first-metal to second-metal incompatible interfaces of the prior art.

Figure 4A:
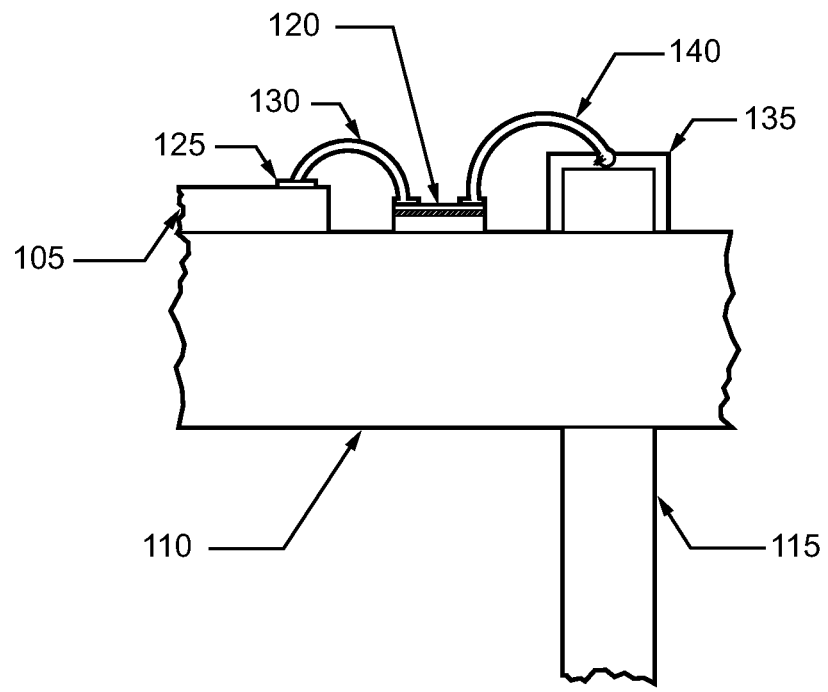
FIG. 4a illustrates yet another exemplary embodiment of a chip-package assembly utilizing a transition pad to avoid incompatible metallization.
Figure 4B:
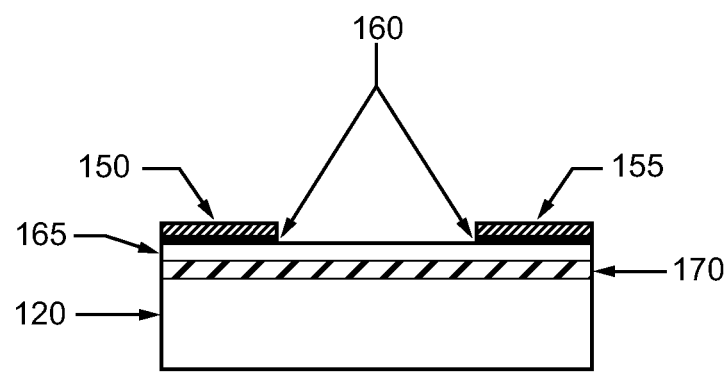

The transition pad 120 is mounted on the header 110 and is disposed between the chip 105 and the package pin. The transition pad 120 may be configured in many ways and may be made of various materials. It shall be understood that in all embodiments, the transition pad 120 is made from a material that can withstand temperatures greater than 200° C. and even greater than 250° C. FIG. 3 illustrates an exemplary embodiment of the transition pad 120 and FIGS. 4a and 4b illustrate another exemplary embodiment of the transition pad 120. Referring to FIG. 3, there is illustrated a transition pad 120 that comprises a platinum-based top surface 145. Platinum is a strong, high temperature material, that enables connections that are suitable for long-term, high temperature (for example, greater than 250° C.) operation. Further, platinum bonds well to other metals, for example aluminum and gold, and therefore facilitates a strong, isolated bond with both the first-metal wire 130 and the second-metal wire 135 without the formation of Kirkendall voids. It shall be understood that platinum is a suitable metal that may be used for the transition pad 120. However, other metals that have desirable metal bonding properties may also be used.

Alternatively, the transition pad 120 may be fabricated as a silicon-on-insulator (SOI) having an oxidized surface 170, as illustrated in FIGS. 4a and 4b, and may comprise an first-metal pad 150 at a first end and a second-metal pad 155 at a second end. The first-metal pad 150 bonds to and electrically connects to the first-metal wire 130 and the second-metal pad 155 bonds to and electrically connects to the second-metal wire 135. The dielectrically isolated P+ layer 165 of the transition pad 120 serves as an indirect electrical connection between the first-metal pad 150 and the second-metal pad 155, and thus serves as an indirect electrical connection between the first-metal wire 130 and the second-metal wire 135. In some embodiments, various metal barrier films 160 may be utilized under the first-metal pad 150 and the second-metal pad 155 to enable ohmic contacts that are operational over 300° C.

It shall be understood that alternative metallurgies may be used for the transition pad, the wires, and the contact pads on the chip and on the package. The flexibility associated with the use of the transition pad 120 enables the use of various metallurgy schemes previously considered impractical for high temperature operability without the need for an aluminum-gold interface. For example, conductive metals that bond well to aluminum and gold interfaces and are suitable for long-term, high temperature operation may be used for the transition pad, for example but not limited to, gallium nitride, silicon nitride, and other high temperature semiconductors. Further, the material used for the transition pad may be tailored to perform under a specific operating temperature.

It will be apparent to those skilled in the art that modifications and variations may be made in the apparatus and process of the present invention without departing from the spirit or scope of the invention. It is intended that the present invention cover the modification and variations of this invention provided they come within the scope of the appended claims and their equivalents.

What is claimed is:

1. A high temperature interconnect assembly for high temperature electronic operation, comprising:
    an aluminum-aluminum interface interconnecting a semiconductor chip and a transition pad;
    a gold-gold interface interconnecting a package contact and the transition pad;
    wherein the transition pad is disposed between the aluminum-aluminum interface and the gold-gold interface and facilitates communication between the semiconductor chip and the package contact.

2. The assembly of claim 1, wherein there are no aluminum-gold interfaces.

3. The assembly of claim 1, wherein the aluminum-aluminum interface comprises an aluminum pad disposed on a top surface of the semiconductor chip and an aluminum wire that interconnects the aluminum pad and the transition pad.

4. The assembly of claim 1, wherein the gold-gold interface comprises a gold plated surface disposed on a top surface of the package contact and a gold wire that interconnects the gold plated surface and the transition pad.

5. The assembly of claim 1, wherein the transition pad comprises a platinum-based top surface.

6. The assembly of claim 1, wherein the transition pad is a silicon-on-insulator device.

7. The assembly of claim 6, wherein the transition pad comprises an aluminum pad at a first end and a gold pad at a second end.

8. The assembly of claim 7, wherein the aluminum pad corresponds with the aluminum wire.

9. The assembly of claim 7, wherein the gold pad corresponds with the gold wire.

10. The assembly of claim 7, further comprising metal barrier films disposed between the aluminum pad and the transition pad and the gold pad and the transition pad.

11. A high temperature interconnect assembly for high temperature electronic operation, comprising:
    a semiconductor chip comprising at least one first-metal pad disposed on a first surface of a header;
    a second-metal plated package pin extending through the header, wherein the second-metal is incompatible with the first-metal; and
    a transition pad disposed on the first surface of the header and between the semiconductor chip and the second-metal plated package pin;
    wherein the first-metal pad on the semiconductor chip and the transition pad are in electrical communication via a first-metal interconnect; and
    wherein the second-metal plated package contact and the transition pad are in electrical communication via a second-metal interconnect.

12. The assembly of claim 11, wherein the transition pad facilitates communication between the semiconductor chip and the second-metal plated package pin.

13. The assembly of claim 11, wherein there are no first-metal to second-metal interfaces.

14. The assembly of claim 11, wherein the transition pad comprises a platinum-based top surface.

15. The assembly of claim 11, wherein the transition pad comprises silicon carbide.

16. The assembly of claim 11, wherein the transition pad is a silicon-on-insulator device comprising an oxidized surface.

17. The assembly of claim 16, wherein the transition pad comprises a first-metal pad at a first end and a second-metal pad at a second end.

18. The assembly of claim 17, wherein the first-metal pad corresponds with the first-metal interconnect.

19. The assembly of claim 17, wherein the second-metal pad corresponds with the second-metal interconnect.

20. The assembly of claim 17, further comprising metal barrier films disposed between the first-metal pad and the transition pad and the second-metal pad and the transition pad.

* * * * *